United States Patent [19]
Balachandran et al.

[11] Patent Number: 5,874,384
[45] Date of Patent: Feb. 23, 1999

[54] ELONGATE BI-BASED SUPERCONDUCTORS MADE BY FREEZE DRIED CONDUCTING POWDERS

[75] Inventors: Uthamalingam Balachandran, Hinsdale, Ill.; Milan Lelovic; Nicholas G. Eror, both of Pittsburgh, Pa.

[73] Assignee: The University of Chicago, Chicago, Ill.

[21] Appl. No.: 829,096

[22] Filed: Mar. 31, 1997

[51] Int. Cl.$^6$ .......................... H01B 12/00; H01L 39/24
[52] U.S. Cl. .......................... 505/230; 505/230; 505/232; 505/430; 505/433; 505/704; 29/599; 174/125.1
[58] Field of Search .................... 505/230, 232, 505/430, 433, 704; 29/599; 174/125.1; 427/62

[56] References Cited

U.S. PATENT DOCUMENTS 5,347,085  9/1994  Kikuchi et al. .................. 505/231

OTHER PUBLICATIONS

Nikulin et al, IEEE Transactions on Magnetics vol. 30, No. 4, pt. 2, Jul. 1994, pp. 2368–2371.

*Primary Examiner*—Roy V. King
*Attorney, Agent, or Firm*—Emrich & Dithmar

[57] ABSTRACT

A superconducting tape or wire with a longitudinally extending outer layer of Ag or its alloys defining an inner region, an area of Ag or its alloys in said inner region extending longitudinally of said tape or wire separated from said outer layer of metal by freeze dried superconducting material. The inner Ag area may be a rod, a tube or a number of wires. The superconductor material is preferably B-2223.

28 Claims, 2 Drawing Sheets

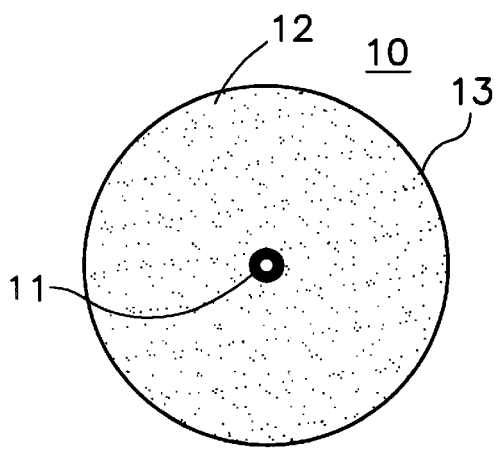
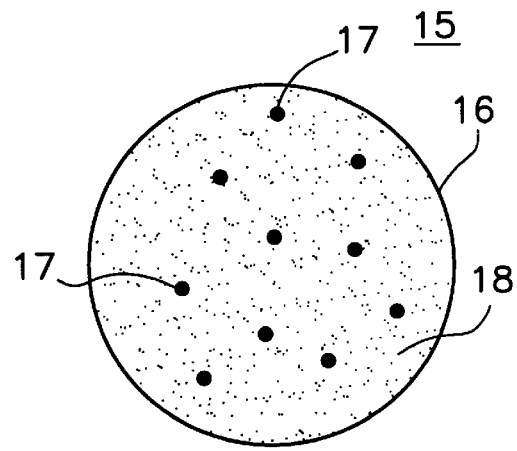
FIG. 1  FIG. 2
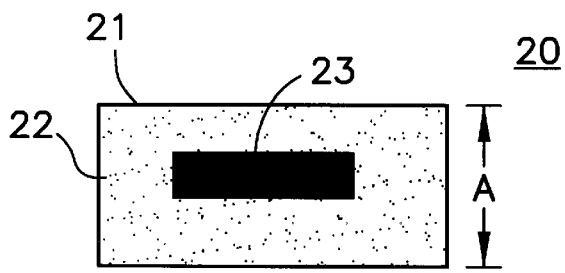
FIG. 3

ELONGATE BI-BASED SUPERCONDUCTORS MADE BY FREEZE DRIED CONDUCTING POWDERS

BACKGROUND OF THE INVENTION

The present invention relates to a superconducting tape or wire produced by the wire-in tube method. Superconducting tapes and wires are principally made by the well known powder-in tube (PIT) method. It is heretofore been suggested that a wire-in tube (WIT) method be employed using one or more strands of wire in the tube prior to introducing the superconductor powder into the tube. Thereafter, the manufacturing of the tape or wire follows the same manufacturing process as the-traditional PIT, that is calcining, annealing and sintering steps are used in conjunction with mechanical swaging or drawing to provide the final tape.

This invention revolves around the discovery that wire-in tube tapes have shown little, if any, improvement over traditional PIT tapes except if certain specific superconducting powder or precursors thereof are used. The powders which form the basis for the invention are reported in U.S. Pat. No. 5,523,285 issued Jun. 4, 1996 to Balachandran et al. which describes therein the freeze dried preparation of Pb-doped $Bi_2Sr_2Ca_2Cu_3O_x$ (2223) which more specifically is $Bi_{1.8}Pb_{0.4}Sr_{2.0}Ca_{2.2}Cu_{3.0}O_y$, where y is between 10 and 11. The freeze dried powders used in the present invention may be either crystalline or non-crystalline or mixtures thereof.

SUMMARY OF THE INVENTION

Accordingly, it is an object of the invention to provide an improved wire-in tube construction in which the superconductor powder or precursor is manufactured by a freeze drying process such as disclosed in U.S. Pat. No. 5,523,285.

Another object of the invention is to provide a method of making a WIT employing freeze dried superconducting powders.

Still another object of the invention is to provide a new article comprising alternating layers of superconducting material made from freeze dried particles and silver or its alloys.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated.

FIG. 1 is a cross sectional view showing a wire-in-tube configuration before mechanical working in which the wire is a single tubular member;

FIG. 2 is a view in cross-section of another embodiment of the invention showing a plurality of solid wires extending longitudinally of the tube surrounded by superconductor material;

FIG. 3 is a view in cross-section after mechanical working showing a tape constructed from a configuration like FIG. 1.

DESCRIPTION OF THE PREFERRED EMBODIMENT

Figure 4:
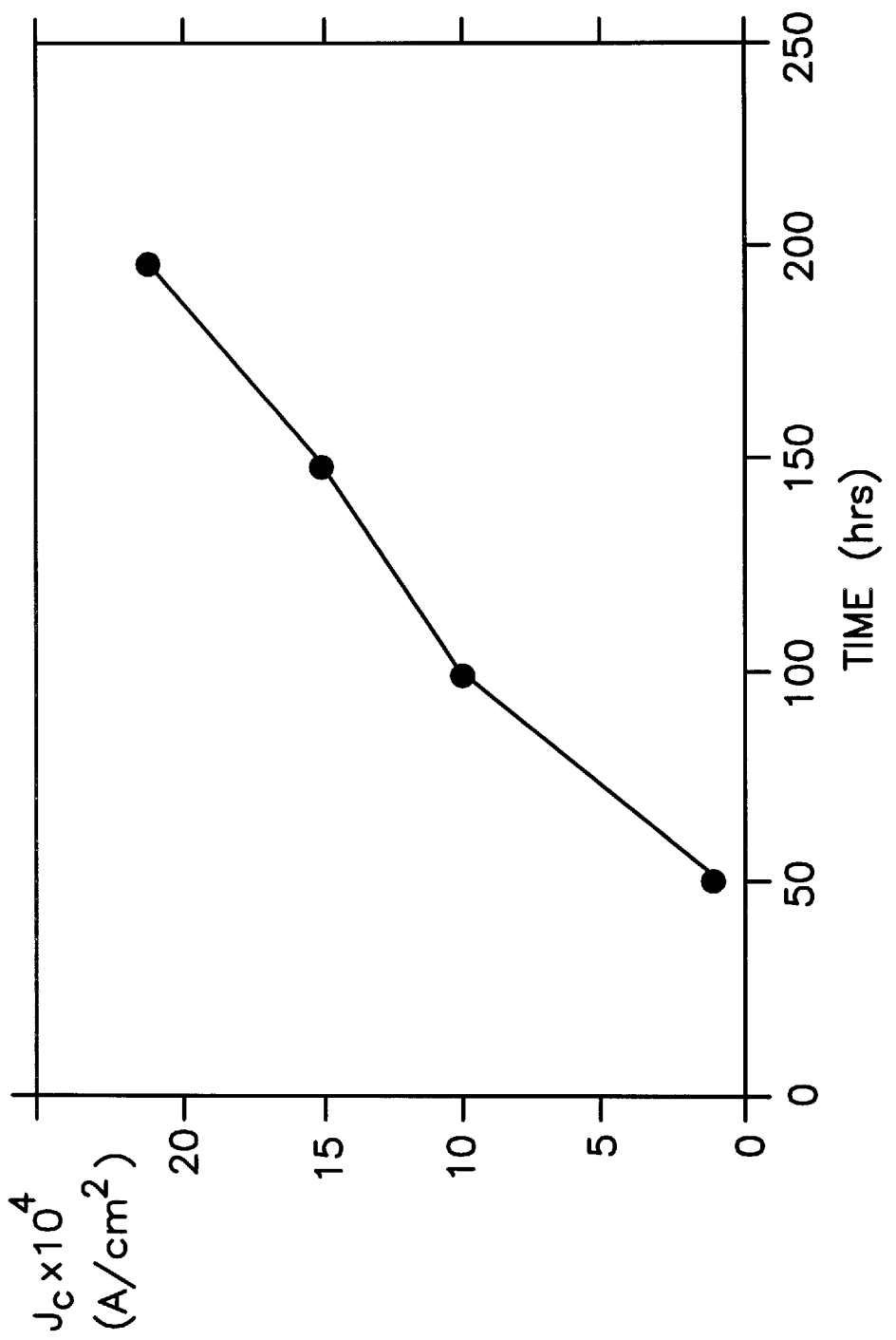
FIG. 4 is a graphical progression of $J_c$ with time at 800° C. in a 7% $O_2$ atmosphere.

This invention relates to high $T_c$ wires and tapes produced by the wire-in tube process. While the foregoing invention will be described with respect to the use of silver, it should be understood that various silver alloys which do not react with the included superconductor material are intended to be covered by the invention. For instance, silver and gold, silver and alumina and silver with a magnesium nickel alloy are all contemplated to be covered within the scope of the invention as are other silver alloys not mentioned but which are chemically non-reactive with the included superconductive material.

Although described principally with respect to the bismuth-2223 superconductor including the Pb-doped version, the invention also applies to the yttrium 123 material, well known in the art, and more specifically, $YBa_2Cu_3O_y$ where y is between 6 and 7 as well as thalium-calcium-barium-copper oxide superconductor.

In the prior art powder-in tube (PIT) process, superconductor powder is packed into a metallic tube, for instance silver or its superconductor compatible alloys and then drawn and rolled (mechanically deformed) to form long lengths of wires and tapes. Long length Pb-doped Bi-2223 tapes (over 1 km) have been fabricated. The Bi-2223 superconductor more specifically is in its preferred form $Bi_{1.8}Pb_{0.4}Sr_{2.0}Ca_{2.2}Cu_{3.0}O_y$, where y is between 10 and 11. Measurements of these long length superconductors have shown $J_c$ of approximately 12,000 A/cm$^2$ at 77K and zero applied magnetic field. Short length samples, typically lengths up to about 5 cm fabricated by the PIT process exhibit $J_c$'s of approximately 40,000 A/cm$^2$ at 77K.

We have discovered that the region of high $J_c$ in the Bi-2223 PIT is adjacent to the silver sheath. We sliced the PIT processed tapes in the rolling direction and separated the two sides of the tape to reveal that a 10 micron layer next to the silver had $J_c$'s on the order of 120,000 A/cm$^2$ at 77K. Our observation in addition to results from magneto-optical imaging, transmission electron microscopy and microslicing experiments all point to the fact that the current-carrying cross section of the tape is principally a fraction of the total cross section of the PIT processed tape adjacent the silver sheet. Accordingly, we determined that a very thin layer of superconductor at the interface with the Ag carries the most current, with the core of the tape contributing little to the current-carrying capacity of the tape.

Prior work indicated that merely inserting wire through a tube to provide a wire-in tube process did not significantly improve the current-carrying capacity of the resultant product. However, we have discovered, unexpectedly, that using a freeze dried superconductor powder or precursor thereof such as described in the Balachandran et al. U.S. Pat. No. 5,523,285, issued Jun. 4, 1996, the disclosure of which is herein incorporated by reference, provides in combination with the method a vastly improved superconductor wire or tape. The thickness of the superconducting material between silver layers should not exceed about 5 microns and is preferably much thinner, such as in the 2000 Å range. Except for the introduction of the silver wire(s) and the use of freeze dried superconductor material or precursor thereof, all the processing was the same as the conventional PIT process.

Referring now to the drawings, there is disclosed in FIG. 1 a WIT 10 with an axially extending central tubular member 11 of silver or an alloy thereof compatible with the superconductor material 12 which surrounds the inner tube 11. The tube 11 could also be a rod or wire of silver or its superconductor-compatible alloys. The superconductor material 12 may be Bi 2223 material or precursor material thereof such as Bi-2212 material described in the incorporated '285 patent. Alternatively, the superconductor material may be a yttrium 123 material or a thallium material or various precursors thereof, all as is well understood in the art. The innertube 11 of Ag or its alloy surrounded by an area of superconductive material 12 is all contained in an outer sheath 13 of Ag or its superconductor-compatible alloys.

Referring to FIG. 2, there is disclosed an embodiment 15 in which a tube of silver or its alloy 16 encapsulates or surrounds a plurality of wires 17 each of which extend substantially axially of the sheath or conduit 16 surrounded by an area of superconductor material 18. FIG. 3 shows a tape 20 in which the outer surface of the tape 21 is silver or an alloy thereof which defines an inner area or space 22 of superconductor material and a metal area 23 interior of the inner space defined by the outer sheath 21 which is also metal and preferably the same composition of metal as the outer sheath 21, although the metal 23 may be different. What is important is that the thickness shown by the dimension A in FIG. 3 of the tape 20 be not greater than about 200 microns and the distance between the superconductor material and the next adjacent layer of Ag or an alloy thereof not be greater than in the range of from about 2,000 Å to about 5 microns, the thinner being better.

Actual examples of the inventors' work was reported in an article in IOP Publishing Ltd. in the Superconducting Science Technology, Vol. 9, pgs. 201–204, wherein the following description of the invention and report of experiments which reduced the invention to practice were reported.

To achieve high $J_c$ values with the PIT technique, it is important to control the processing parameters, especially the phase content of the precursor powder, the particle size of the starting powder and the packing density. The presence of a liquid phase accompanies the phase transformation from $(Bi, Pb)_2Sr_2Ca_1Cu_2O_x$ (2212) to the 2223 phase. Pre-reacted powder in the form of the 2212 crystalline phase and a secondary phase that is either crystalline or a non-crystalline amorphous phase, followed by in-tape phase transformation to the 2223 phase improved $J_c$ significantly. An initially small particle size is important for obtaining high $J_c$ tapes. A precursor powder with a packing density of ~25% with respect to the theoretical density of the 2223 phase in a two-powder process leads to a $J_c$ of 30 kA cm$^{-2}$ (critical current Ic=59 A).

We found a $J_c$ value above $10^5$ A cm$^{-2}$ in a Bi-2223 superconducting tape. The $J_c$ values were measured on tapes made by the Ag wire-in-tube method, in which the silver wire extends along the entire length of the tape. The thickness of the superconducting core between the silver layers was 1–2 $\mu$m.

Except for the introduction of the Ag wire, all of the processing was the same as in the well known PIT method. A precursor powder of composition $Bi_{1.8}Pb_{0.4}Sr_{2.0}Ca_{2.2}Cu_{3.0}O_y$, where y is between 10 and 11, was prepared by a freeze-drying process that incorporated a splat-freezing step, as described in the '285 patent. The freeze-dried powder, which showed high reactivity and chemical homogeneity, was heat treated at 800° C. for 2 hours in a 7% $O_2$ atmosphere. Before it was packed into the Ag tube, the powder had an average particle size of 1 $\mu$m and x-ray analysis showed 2212 peaks. The packing density was ~25% of the theoretical density of the 2223. The powder preferably has a mean particle diameter in the range of from about 0.5 micron to about 3 micron and most preferably not greater than about 2 micron. The tube with the silver wire was drawn and rolled to a tape that was ~200 $\mu$m thick. Short samples, ~5 cm long, were cut and thermomechanically processed at various temperatures between 790° and 810° C. in a 7% $O_2$ atmosphere. After each 50 h of heat treatment, an intermediate pressing was performed with a 36.3×10$^3$ kg (40 tons) load. The transport critical current ($I_c$) (77K, self-field, 1 $\mu$V cm$^{-1}$ criterion) was measured by a conventional four-probe method over a distance of 2 cm. The cross-sectional area of the sample was observed by scanning electron microscopy (SEM); compositional analysis was accomplished by energy dispersive spectroscopy (EDS).

It has been established that practical applications of Bi-2223 high-temperature superconducting material require a $J_c$ of at least $10^5$ A cm$^{-2}$ in long wires and tapes; at 77K and a high magnetic field. $J_c$ is a material property controlled by microstructure. Recently much attention has been focused on the distribution of current inside the tape. The possible presence of a high $J_c$ region adjacent to the silver in silver tapes was studied. The existence of such a region is important for practical applications because of the substantial $J_c$ in this interface region compared with that of the core of the superconductor.

In the Ag wire-in-tube method, silver wire was introduced along the entire length of the tape. The silver provides a surface for the reaction-induced texturing that occurs during thermomechanical treatment of the tape. Furthermore, by replacing the central core with Ag the difference between the nominal cross-sectional area and the actual current-carrying cross-sectional area was decreased.

FIG. 4 shows the progression of critical current density with annealing time at 800° C. in a 7% $O_2$ atmosphere for an applied load of 36.3×10$^3$ kg (40 tons). The best result, $J_c \geq 2.0 \times 10^5$ A cm$^{-2}$ ($I_c$ was 22A), was obtained after 200 h and three intermediate pressings. Therefore, the $J_c$ value of $10^5$ A cm$^{-2}$ at 77K in a self-field achieved previously in short samples of peeled Bi-2223 tapes was confirmed.

Unmounted cross sections of the samples were observed by SEM. The cross-sections were individually measured for each sample. A low-magnification SEM image, taken in the secondary-electron imaging (SEI) mode, of the cross-sectional area showed that was perpendicular to the rolling direction of the tape. The samples were heat treated for 100 h at 800° C. in a 7% $O_2$ atmosphere. The average thickness of the superconducting layer was approximately 1–2 $\mu$m and the width was 3.6 mm. Surface roughness was due to the sample preparation by ion milling through the rolled tape. It is important to acknowledge that the thin BSCCO layers are 'sausaged' and that introduces error in the calculation of the nominal area. Plate-like grains of BSCCO-2223 phase with an average grain thickness on the order of ~1 $\mu$m were found.

The measured current-carrying capacity of tapes ($I_c$) with or without the Ag wire at the central core is the same. This shows that the current-carrying region within the tape is the region next to the Ag sheath, as suggested earlier. These results provide an approach for increasing the $J_c$ of BSCCO tapes by increasing the interfacial area between the superconductor and Ag, and thus allow for $J_c$ values of $10^5$ A cm$^{-2}$. The PIT process, as it stands today, produces a superconducting core that does not carry significant current. The current invention permits tape design to be modified to maximize the area of superconductor in contact with Ag so that the regions of high $J_c$ extend throughout the thickness of the superconductor tape.

Accordingly, by using freeze dried superconductor powders in combination with the wire-in-tube method, critical current densities above $10^5$ A/cm$^2$ in polycrystalline samples at 77K in a self field, a maximum $J_c$ of $2\times10^5$ A/cm$^2$ was measured after 3 pressing cycles at a heat treatment temperature of 800° C. in an enriched atmosphere of 7% oxygen. Microstructural observation showed that the average thickness of the superconducting layer between the silver layers was on the order of 1–2 microns and the width was about 3.6 mm.

While there has been disclosed what is considered to be the preferred embodiment of the present invention, it is understood that various changes in the details may be made without departing from the spirit, or sacrificing any of the advantages of the present invention.

The embodiments of the invention in which an exclusive property or privilege is claimed are defined as follows:

1. An elongated tape or wire comprising an outer electrically conductive metal shell defining an inner region and areas of a metal and a Bi-based oxide superconductor disposed within said inner region, wherein said oxide superconductor is produced from phase-clean freeze dried powder and said metal in said inner region extends substantially the entire length of the elongated tape or wire.

2. The elongated tape or wire of claim 1, wherein said metal is one or more of Ag and its alloys.

3. The elongated tape or wire of claim 1, wherein said metal in said inner region is the same as the metal in said outer shell.

4. The elongated tape or wire of claim 1, wherein said superconductor is phase-clean 110 K Bi-2223 superconductor.

5. The elongated tape or wire of claim 1, wherein the freeze dried powder used to produce the superconductor had an average particle diameter in the range of from about 0.5 to about 3 microns.

6. The elongated tape or wire of claim 1, wherein the metal in the inner region is one or more thin wires extending longitudinally of said tape or wire.

7. The elongated tape or wire of claim 1, wherein the metal in the inner region is one or more thin tubes extending longitudinally of said tape or wire.

8. The elongated tape or wire of claim 1, wherein the distance between adjacent areas of superconductor and metal does not exceed 5 $\mu$m.

9. The elongated tape or wire of claim 1, wherein the distance between adjacent areas of superconductor and metal is between 2000 Å and 5 $\mu$m.

10. The elongated tape or wire of claim 1, wherein the thickness of said tape is less than 200 $\mu$m.

11. A superconducting tape or wire comprising a longitudinally extending outer layer of Ag or its alloys defining an inner region, an area of Ag or its alloys in said inner region extending longitudinally of said tape or wire separated from said outer layer of metal by phase-clean freeze dried superconducting material, wherein said phase-clean superconductor material is Bi-2223.

12. The superconducting tape or wire of 11, wherein, the superconductor is $(Bi,Pb)_2Sr_2Ca_2Cu_3O_y$ where y is between 10 and 11.

13. The superconducting tape or wire of 12, wherein the superconductor is $Bi_{1.8}Pb_{0.4}Sr_{2.0}Ca_{2.2}Cu_{3.0}O_y$.

14. The superconducting tape or wire of claim in 11, wherein there are more than one discrete areas of Ag or its alloys in said inner region extending longitudinally of said tape or wire.

15. A superconductor tape or wire made by introducing one or more elongate members of Ag or its alloys and a phase-clean freeze dried oxide superconducting powder or precursor thereof into an elongated conduit of Ag or its alloys, converting the conduit containing the freeze dried Bi-based oxide superconductor or precursor thereof into a tape or wire, and thermomechanically treating the tape or wire to produce a tape or wire having an outer shell of Ag or its alloys and an inner region of Ag or its alloys in a Bi-based oxide superconductor material.

16. The superconducting tape of claim 15, wherein the superconducting powder or precursor thereof includes crystalline material.

17. The superconducting tape of claim 15, wherein the superconducting powder or precursor thereof includes non-crystalline material.

18. The superconducting tape of claim 15, wherein the superconducting powder or precursor thereof includes crystalline and non-crystalline material.

19. The superconducting tape of claim 18, wherein the superconducting powder or precursor thereof includes crystalline and non-crystalline $(Bi,Pb)_2Sr_2CaCu_2O_x$ where x is between 8 and 9, (2212) material converted in situ to $(Bi,Pb)_2Sr_2Ca_2Cu_3O_y$ where y is between 10 and 11, material during thermomechanical treatment.

20. The superconducting tape of claim 19, wherein the thermomechanical treatment includes one or more heating, holding and pressing cycles.

21. A superconducting article made by the wire-in-tube method comprising alternating layers of a bi-based oxide superconducting material made from phase-clean freeze dried particles and Ag or its alloys, wherein there are at least three discrete regions of Ag or its alloys.

22. The superconducting article of claim 21, wherein the superconducting material includes $(Bi,Pb)_2Sr_2CaCu_2O_y$, where y is in the range of from 10 to 11.

23. A method of forming a composite of metal and a Bi-based oxide superconducting material, comprising providing a metal container, positioning a metal member and a phase-clean freeze dried Bi-based oxide superconducting powder or precursor thereof inside said metal container, subjecting said metal container to at least one thermomechanical treatment of heating, holding and pressing to provide a composite material having an outer shell of metal and interior regions of metal and the Bi-based oxide superconducting material.

24. The method of claim 23, wherein the metal container is a tube.

25. The method of claim 23, wherein the metal container is selected from the group consisting of Ag and its alloys.

26. The method of claim 25, wherein the metal container is a conduit and the metal member is a Ag wire.

27. The method of claim 26, wherein the superconducting material includes Bi-2223 material, and wherein the thermomechanical treatment includes heating at a temperature not less than about 790° C.

28. The method of claim 27, wherein the thermomechanical treatment includes holding at an elevated temperature for a time not less than about 2 hrs.

* * * * *